US010495498B2

(12) United States Patent
Iwashita et al.

(10) Patent No.: US 10,495,498 B2
(45) Date of Patent: Dec. 3, 2019

(54) FIELD DEVICE (71) Applicant: Yokogawa Electric Corporation, Musashino-shi, Tokyo (JP)

(72) Inventors: Junichi Iwashita, Tokyo (JP); Toru Shimura, Tokyo (JP); Daisuke Harigane, Tokyo (JP); Wandong Li, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 463 days.

(21) Appl. No.: 15/099,872

(22) Filed: Apr. 15, 2016

(65) Prior Publication Data
US 2016/0313155 A1    Oct. 27, 2016

(30) Foreign Application Priority Data

Apr. 24, 2015  (JP) ................................. 2015-089313

(51) Int. Cl.
*G01F 1/58*     (2006.01)
*G05B 19/042*   (2006.01)
*H03M 3/00*     (2006.01)

(52) U.S. Cl.
CPC ......... *G01F 1/588* (2013.01); *G05B 19/0423* (2013.01); *H03M 3/458* (2013.01);
(Continued)

(58) Field of Classification Search
CPC ....... G01F 1/588; G01F 1/58; G05B 19/0423; G05B 2219/21137; G05B 2219/49023; H03M 3/458; H02H 1/0038
(Continued)

(56) References Cited

U.S. PATENT DOCUMENTS 5,351,554 A     10/1994  Budmiger
5,487,310 A *   1/1996   Higuchi .................... G01F 1/60
                                              73/861.17
(Continued)

FOREIGN PATENT DOCUMENTS

EP    0521169 A1    1/1993
JP    11-132805 A   5/1999
(Continued)

OTHER PUBLICATIONS

Baker. Bonnie, "A Glossary of Analog-to-Digital Specifications and Performance Characteristics", Texas Instruments, Application Report, SBAA147B, Aug. 2006, Revised Oct. 2011, Retrieved from the Internet on Sep. 8, 2016, 33 pages total.
(Continued)

*Primary Examiner* — Dzung Tran
(74) *Attorney, Agent, or Firm* — Sughrue Mion, PLLC (57) ABSTRACT A field device according to one aspect of the present invention includes a sensor, an analog-digital converter configured to continuously convert detected signals output from the sensor to digital signals, and a calculator configured to convert the digital signals to process values. The calculator starts acquisition of the digital signals output from the analog-digital converter at a first point in time that is delayed by a processing time required for the conversion process of the analog-digital converter from a start point of a timing signal defining a sampling section of the detected signals, and finishes the acquisition of the digital signals output from the analog-digital converter at a second point in time that is delayed by the processing time from an end point of the timing signal.

18 Claims, 4 Drawing Sheets (52) U.S. Cl.
CPC ............... *G05B 2219/21137* (2013.01); *G05B 2219/49023* (2013.01)

(58) Field of Classification Search
USPC .......................................................... 702/45
See application file for complete search history.

(56) References Cited

U.S. PATENT DOCUMENTS

| | | | |
|---|---|---|---|
| 6,552,675 | B1 | 4/2003 | Allin et al. |
| 6,611,785 | B1* | 8/2003 | Yamanaka ............ G01F 1/3209 702/155 |
| 2004/0015302 | A1* | 1/2004 | Suzuki ...................... G01F 1/58 702/38 |
| 2007/0279260 | A1* | 12/2007 | Harigane ............... G05B 21/02 341/50 |
| 2009/0071264 | A1* | 3/2009 | Wray ...................... G01F 1/588 73/861.12 |
| 2010/0300211 | A1* | 12/2010 | Sugawara ................ G01F 1/60 73/861.11 |
| 2011/0239778 | A1* | 10/2011 | Mitsutake ................ G01F 1/60 73/861.12 |
| 2013/0289897 | A1 | 10/2013 | Yamaguchi et al. |

FOREIGN PATENT DOCUMENTS

| | | |
|---|---|---|
| JP | 2010-276470 A | 12/2010 |
| JP | 2011-033491 A | 2/2011 |
| JP | 2012-093168 A | 5/2012 |
| JP | 2014206508 A | 10/2014 |

OTHER PUBLICATIONS

Communication dated Apr. 19, 2018, from the European Patent Office in counterpart European Application No. 16165567.5.
Gong, Shang-Fu, Microcomputer Principle and Interface, 2nd Edition, Aug. 2008, pp. 338-339, vol. 39, University of Electronics Science and Technology Press. (8 pages total).
Office Action dated Aug. 19, 2019 by the State Intellectual Property Office of P.R. China in counterpart Chinese Patent Application No. 201610251383.9.

* cited by examiner

FIELD DEVICE

BACKGROUND OF THE INVENTION

Field of the Invention

The present invention relates to a field device.

Priority is claimed on Japanese Patent Application No. 2015-089313, filed Apr. 24, 2015, the contents of which are incorporated herein by reference.

Description of Related Art

In a plant or a factory or the like, a distributed control system (DCS) has been implemented to realize a high level of automated operation. In the DCS, on-site devices, which are referred to as field devices, are connected via a communication means to controllers, which control the field devices. The field devices used in the DCS are classified into measures such as flowmeters and temperature sensors, and operating devices such as valve devices and actuator devices.

The measure that is a type of the field device generally includes sensors that detect a variety of state quantities (e.g., flow rate, temperature, etc.), an amplifier that amplifies detection signals of the sensors, an analog-digital (A/D) converter that converts the amplified detection signals to digital signals, a calculator that converts the digital signals to process values, and an output that outputs the process values to the outside. Also, the operating device that is a type of the field device basically performs an operation based on the control of the control device, and may include sensors and an A/D converter like the measure. For example, the valve device may include sensors and an A/D converter in order to detect the actual degree of opening of the valve.

Patent Literature 1 (Japanese Unexamined Patent Application, First Publication No. 2012-93168), Patent Literature 2 (Japanese Unexamined Patent Application, First Publication No. 2011-33491), and Patent Literature 3 (Japanese Unexamined Patent Application, First Publication No. 2010-276470) disclose an example of a conventional electromagnetic flowmeter that is a type of a field device. The electromagnetic flowmeter, for example, detects an electromotive force (an electromotive force proportional to a flow velocity) generated by applying a magnetic field to a fluid flowing in a pipe, and measures the flow rate of the fluid. The electromagnetic flowmeter includes components (components equivalent to the sensors, the amplifier, the A/D converter, the calculator, and the output) that converts a result of detecting the electromotive force to a process value (a flow rate) and outputs the converted result to the outside.

A representative of an A/D converter provided in a field device includes a successive comparison type A/D converter and a $\Delta\Sigma$ type A/D converter. In all these A/D converters, there occurs a delay (a group delay) corresponding to a time required for a conversion process of converting analog signals to digital signals. For this reason, for example, when a calculator provided in the field device acquires in the digital signals converted by the A/D converter, it is thought that it is necessary to perform the acquisition in consideration of the group delay.

The successive comparison type A/D converter makes it possible to control a section (hereinafter referred to as "sampling section") in which the analog signals are converted into the digital signals, and only the digital signals converted within the sampling section is output from the successive comparison type A/D converter. For this reason, when the successive comparison type A/D converter acquires the digital signals converted within the sampling section, there is no need to consider the group delay. However, the $\Delta\Sigma$ type A/D converter cannot control the sampling section as in the successive comparison type A/D converter, and the digital signals are continuously output from the $\Delta\Sigma$ type A/D converter. For this reason, there is a need to strictly consider the group delay in order to acquire only digital signals required for accurate calculation among the digital signals continuously output from the $\Delta\Sigma$ type A/D converter.

For this reason, there are some cases where, in a field device including an A/D converter (the A/D converter at which the group delay occurs, which cannot control the sampling section and continues to perform the conversion process) like the $\Delta\Sigma$ type A/D converter, it is difficult to accurately acquire only digital signals converted in synchronization with certain cyclic signals. For example, in the electromagnetic flowmeters disclosed in Patent Literatures 1 to 3 above, to avoid an influence of differential noises, only a specific section of the detection signals acquired from the sensor in synchronization with excitation signals (signals for applying a magnetic field to a fluid) is converted to the digital signals. However, there are some cases where, if an A/D converter provided in the electromagnetic flowmeter is, for example, the $\Delta\Sigma$ type A/D converter, it is difficult to accurately acquire only digital signals within the specific section for the aforementioned reason.

SUMMARY OF THE INVENTION

One aspect of the present invention provides a field device capable of accurately and easily acquiring only digital signals converted in synchronization with cyclic signals even if the field device includes an A/D converter that continuously performs a conversion process.

A field device according to one aspect of the present invention may include a sensor, an analog-digital converter configured to continuously convert detected signals output from the sensor to digital signals, and a calculator configured to convert the digital signals to process values. The calculator may start acquisition of the digital signals output from the analog-digital converter at a first point in time that is delayed by a processing time required for the conversion process of the analog-digital converter from a start point of a timing signal defining a sampling section of the detected signals, and finish the acquisition of the digital signals output from the analog-digital converter at a second point in time that is delayed by the processing time from an end point of the timing signal.

In the above-mentioned field device, the calculator may include a first counter configured to count a time from the start point to the end point of the timing signal, and a second counter configured to count the processing time.

In the above-mentioned field device, each of the first counter and the second counter may be configured to start count at the start point of the timing signal. The calculator may be configured to set a time point when the count of the second counter is finished as the first point and to set a time point when the time counted by the first counter is elapsed from the time point when the count of the second counter is finished as the second point.

In the above-mentioned field device, the timing signal may include a plurality of timing signals. The calculator may be configured to individually start and finish the acquisition of the digital signals for each of the plurality of timing signals.

The above-mentioned field device may further include an output configured to output the process values converted from the digital signals by the calculator.

In the above-mentioned field device, the field device may be an electromagnetic flowmeter configured to detect an electromotive force generated by applying a magnetic field to a fluid to measure a flow rate of the fluid.

The above-mentioned field device may further include an amplifier circuit configured to amplify the detected signals output from the sensor and to input the amplified detected signals into the analog-digital converter.

In the above-mentioned field device, the analog-digital converter may be a ΔΣ type analog-digital converter.

In the above-mentioned field device, the output may include a transmitter configured to convert the process values output from the calculator to transmittable signals and to transmit the transmittable signals to an outside of the field device, and a display configured to display the process values output from the calculator.

The above-mentioned field device may further include an excitation circuit configured to generate an excitation signal to be supplied to the sensor based on an excitation control signal output from the calculator.

In the above-mentioned field device, the excitation circuit may be configured to generate the excitation signal, which has a waveform of a rectangular shape, and polarities of which are alternately changed in a predetermined cycle.

In the above-mentioned field device, the sensor may be configured to output the detected signals synchronized with the excitation signal.

The above-mentioned field device may further include a clock configured to output the timing signal.

In the above-mentioned field device, the clock may be configured to output the timing signal, a frequency of which is set to twice a frequency of the excitation signal.

In the above-mentioned field device, the first counter may be configured to stop count at the end point of the timing signal. The second counter may be configured to continue count at the end point of the timing signal.

In the above-mentioned field device, the calculator may be configured to store a value of the first counter at the end point of the timing signal.

In the above-mentioned field device, the calculator may be configured to acquire the digital signals, the number of which is equal to the value of the first counter, from the first point.

In the above-mentioned field device, the sensor may include two exciting coils configured to be excited by the excitation signal and to generate a magnetic field to be applied to the fluid.

In the above-mentioned field device, the exciting coil may be configured to alternately apply a first magnetic field based on a positive excitation and a second magnetic field based on a negative excitation to the fluid.

In the above-mentioned field device, the sensor may further include two detecting electrodes configured to detect the electromotive force.

According to one aspect of the present invention, the calculator is configured to start the acquisition of the digital signals output from the A/D converter at a first point in time that is delayed by a time required for the conversion process of the A/D converter from a start point of the timing signal defining a sampling section of the detected signals, and to finish the acquisition of the digital signals output from the A/D converter at a second point in time that is delayed by the time required for the conversion process of the A/D converter from an end point of the timing signal. For this reason, even if the A/D converter that continuously performs the conversion process is provided, only digital signals converted in synchronization with cyclic signals can be accurately and easily acquired.

DETAILED DESCRIPTION OF THE INVENTION

Hereinafter, a field device according to an embodiment of the present invention will be described in detail with reference to the drawings. In the following, to facilitate understanding, as the field device, an electromagnetic flowmeter for measuring a flow rate of a fluid flowing in a pipe will be described by way of example. However, the present invention is not limited to this electromagnetic flowmeter, and it may be applied to arbitrary field devices (measures and operating devices).

Figure 1:
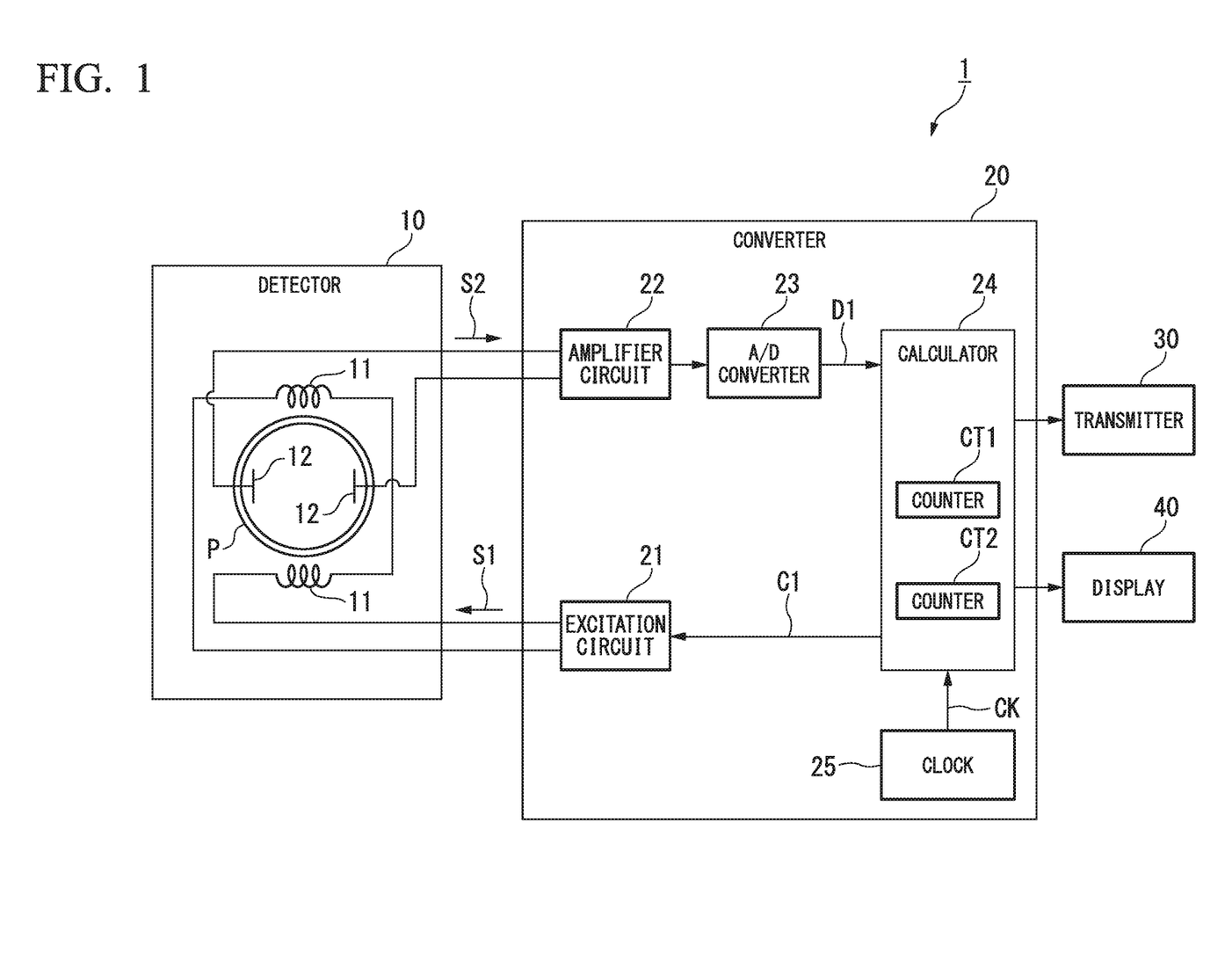
FIG. 1 is a block diagram showing constitutions of main components of an electromagnetic flowmeter acting as a field device according to an embodiment of the present invention.

FIG. 1 is a block diagram showing constitutions of main components of an electromagnetic flowmeter acting as a field device according to an embodiment of the present invention. As shown in FIG. 1, an electromagnetic flowmeter (a field device) 1 includes, for example, a detector (a sensor) 10, a converter 20, a transmitter (an output) 30, and a display (an output) 40. The electromagnetic flowmeter 1 detects an electromotive force (an electromotive force proportional to a flow velocity) generated by applying a magnetic field to a fluid acting as a target to be measured to measure the flow rate of the fluid, and outputs the measured result to the outside.

The detector 10 is mounted on a measured pipe P in which the fluid acting as the target to be measured flows. The detector 10 applies a magnetic field to the fluid flowing in the measured pipe P, and detects an electromotive force generated thereby. This detector 10 includes, for example, two exciting coils 11 and two detecting electrodes 12. The exciting coils 11 are disposed outside the measured pipe P. The exciting coils 11 are excited by an excitation signal S1 output from the converter 20, and generate the magnetic field applied to the fluid flowing in the measured pipe P. In the example shown in FIG. 1, the two exciting coils 11 are connected in series, and are disposed across the measured pipe P. However, the number of exciting coils 11 may be one or three or more, and the disposition of the exciting coils 11 may also be set arbitrarily.

The detecting electrodes 12 are provided to detect an electromotive force generated when the magnetic field is applied to the fluid flowing in the measured pipe P. The detecting electrodes 12 are arranged in the measured pipe P to be opposite to each other so as to sandwich a central axis of the measured pipe P. In the example shown in FIG. 1, the two detecting electrodes 12 are arranged in the measured pipe P to be opposite to each other so as to form an angle of 90 degrees with respect to a direction in which the exciting coils 11 are opposite to each other. Flow rate signals (detected signals) S2 based on the detected electromotive force are output from the detecting electrodes 12.

The converter 20 includes, for example, an excitation circuit 21, an amplifier circuit 22, an analog-digital (A/D) converter 23, a calculator 24, and a clock 25. The converter 20 supplies the excitation signal S1 to the detector 10, and measures the flow rate of the fluid flowing in the measured pipe P using the flow rate signals S2 acquired from the detector 10. Also, the converter 20 outputs the measured result (the flow rate of the fluid) to the transmitter 30 or the display 40. The converter 20 is realized by, for example, a digital signal processor (DSP), a gate array, a field-programmable gate array (FPGA), a micro-processing unit (MPU), or the like.

The excitation circuit 21 generates the excitation signal S1 to be supplied to the detector 10 based on an excitation control signal C1 output from the calculator 24. For example, the excitation circuit 21 generates the excitation signal S1 in which polarities are alternately changed at a previously determined excitation frequency (e.g., several to one hundred and several tens of Hz). If the excitation signal S1 is supplied to the detector 10, positive excitation and negative excitation of the exciting coils 11 alternate with each other. The excitation circuit 21 causes the excitation signal S1 when the positive excitation is performed and the excitation signal S1 when the negative excitation is performed to have the same magnitude.

The amplifier circuit 22 is connected to the two detecting electrodes 12 of the detector 10. The amplifier circuit 22 amplifies the flow rate signals S2 acquired from the detecting electrodes 12. The A/D converter 23 performs a conversion process for converting signals output from the amplifier circuit 22 to digital data, and outputs acquired digital data D1 to the calculator 24. The A/D converter 23 is, for instance, a ΔΣ type A/D converter, and continuously performs the conversion process of the signals output from the amplifier circuit 22. In the A/D converter 23, a group delay occurs. The A/D converter 23 cannot control a sampling section like a successive comparison type A/D converter.

The calculator 24 inputs the excitation control signal C1 into the excitation circuit 21 to control the excitation signal S1 to be applied to the exciting coils 11. Also, the calculator 24 acquires the digital data D1 for a period defined by a timing clock CK (timing signal) output from the clock 25 among the digital data D1 continuously output from the A/D converter 23, and measures the flow rate of the fluid flowing in the measured pipe P. In this way, the calculator 24 performs a process of converting the digital data D1 acquired from the A/D converter 23 to a process value (a process value indicating the flow rate).

Here, the calculator 24 starts the acquisition of the digital data D1 output from the A/D converter 23 at a point (a first point) in time that is delayed by a time required for the conversion process of the A/D converter 23 from a start point of the timing clock CK. Also, the calculator 24 finishes the acquisition of the digital data D1 output from the A/D converter 23 at a point (a second point) in time that is delayed by the time required for the conversion process of the A/D converter 23 from an end point of the timing clock CK. Such an acquisition is performed in consideration of the group delay of the A/D converter 23.

The calculator 24 includes, for example, a counter CT1 (a first counter) and a counter CT2 (a second counter), and performs the acquisition using these counters CT1 and CT2.

The counter CT1 counts a time from the start point to the end point of the timing clock CK, and the counter CT2 counts the time (a known time) required for the conversion process of the A/D converter 23. Details of the acquisition process of the digital data D1 using the counters CT1 and CT2 will be described later.

The clock 25 outputs the timing clock CK that defines the sampling section of the signal output from the amplifier circuit 22. To facilitate understanding, the start point of the timing clock CK (the start point of the sampling section) is set as a rise of the timing clock CK, and the end point of the timing clock CK (the end point of the sampling section) is set as a fall of the timing clock CK.

The transmitter 30 converts the measured result (the flow rate of the fluid) output from the calculator 24 to a transmittable signal, and transmits it to the outside. For example, the transmitter 30 converts the measured result output from the calculator 24 to a signal (an analog signal) that can be transmitted by a communication system using 4 to 20 mA signals, and transmits it to a transmission line (a transmission line used for transmission of the 4 to 20 mA signals). The display 40 displays the measured result output from the calculator 24. The display 40 includes, for example, a display device such as a liquid crystal display.

Figure 2:
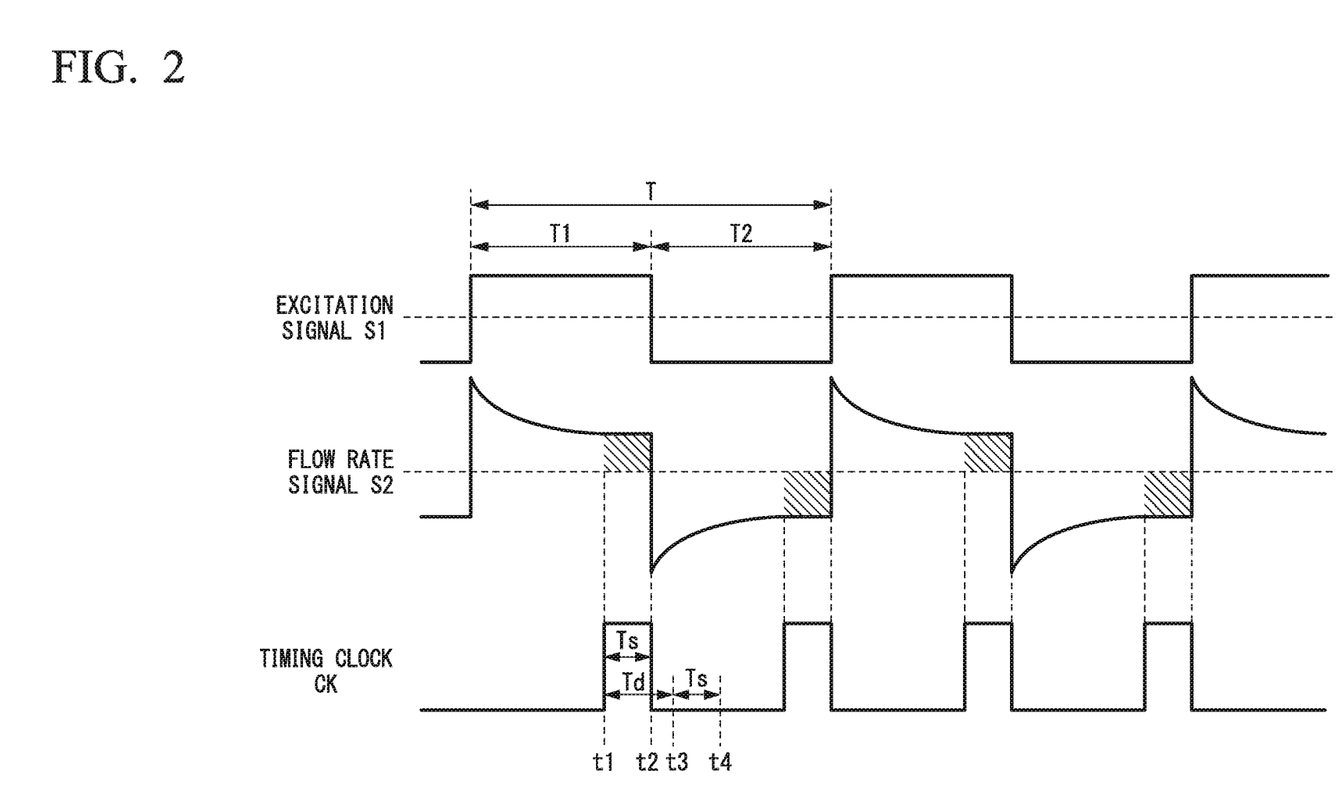
FIG. 2 is a timing chart showing an acquisition process of digital data which is performed in the embodiment of the present invention.
Figure 3:
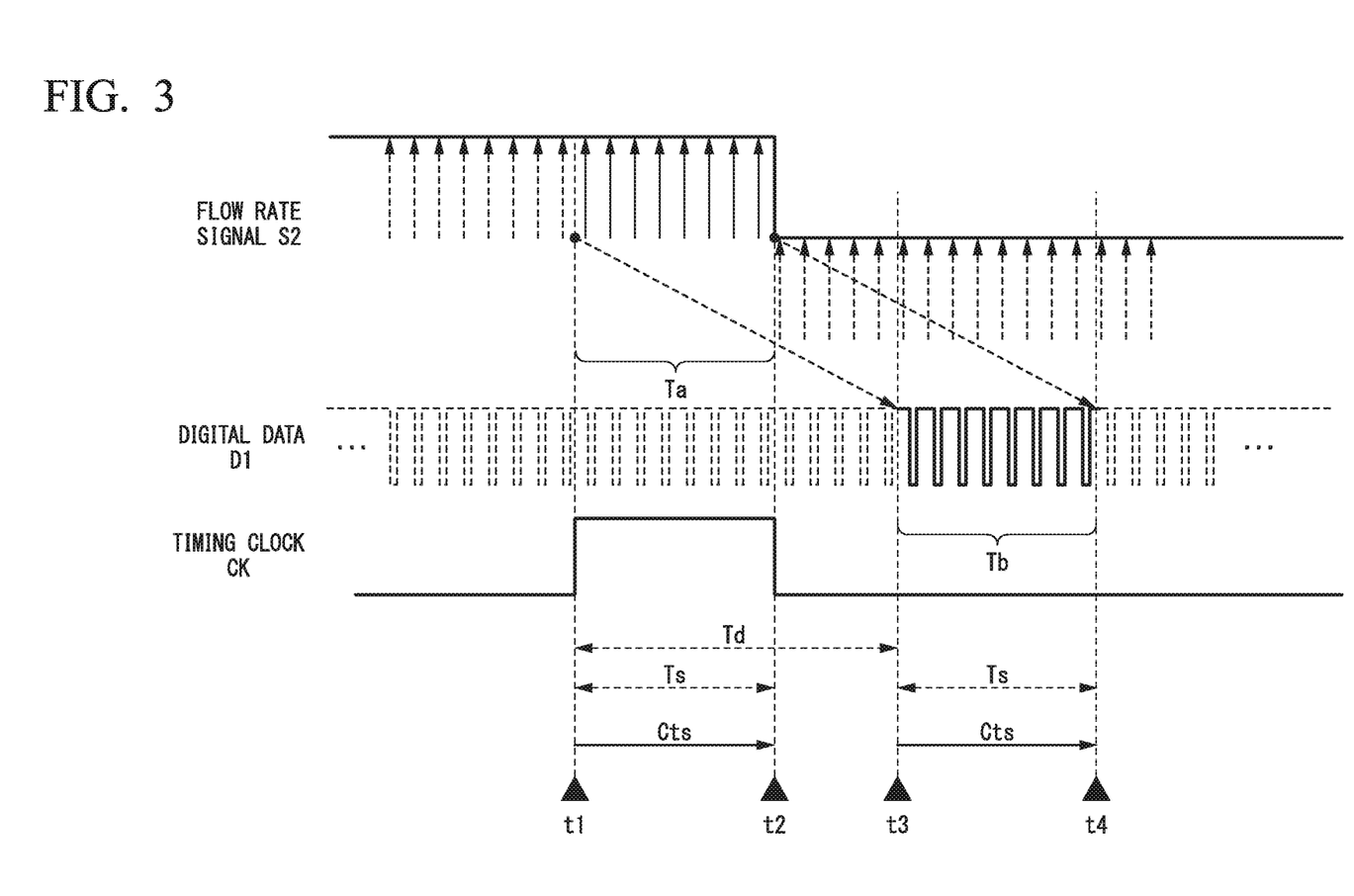
FIG. 3 is a timing chart showing the acquisition process of the digital data which is performed in the embodiment of the present invention.

Next, details of the acquisition process of the digital data D1, which is performed by the calculator 24, will be described. FIGS. 2 and 3 are timing charts showing the acquisition process of the digital data which is performed in the embodiment of the present invention. In FIG. 2, the excitation signal S1, the flow rate signal S2, and the timing clock CK are shown. In FIG. 3, the flow rate signal S2, the digital data D1, and the timing clock CK are shown.

As shown in FIG. 2, the excitation signal S1 has a waveform of a rectangular shape, and polarities are alternately changed in a cycle T. In one cycle of the excitation signal S1, a period of positive polarity is T1, and a period of negative polarity is T2. Also, the flow rate signal S2 is synchronized with the excitation signal S1, rises at a rise timing of the excitation signal S1, and falls at a fall timing of the excitation signal S1. In the flow rate signal S2 as shown in FIG. 2, overshoot appears at a rise portion thereof, undershoot appears at a fall portion thereof, and these are differential noises.

The timing clock CK is a rectangular signal that rises at a start point (e.g., a time t1) of the sampling section and falls at an end point (e.g., a time t2) of the sampling section. In the example shown in FIG. 2, to avoid an influence of differential noise, the sampling section is set to a trailing edge of the section T1 of the positive polarity and a trailing edge of the section T2 of the negative polarity in each cycle of the excitation signal S1. That is, a frequency of the timing clock CK is set to twice the frequency of the excitation signal S1. As shown in FIG. 2, a length of the sampling section (a length from the start point to the end point of the sampling section) is defined as Ts, and the group delay of the A/D converter 23 is defined as Td.

In the example shown in FIG. 2, the calculator 24 starts the acquisition of the digital data D1 output from the A/D converter 23 at a time t3 that is a point in time delayed by the group delay Td that is the time required for the conversion process of the A/D converter 23 from the time t1 that is the start point of the timing clock CK. Also, the calculator 24 finishes the acquisition of the digital data D1 output from the A/D converter 23 at a time t4 when the length Ts of the sampling section has elapsed from the time t3. The time t4 is also the point in time that is delayed by the group delay Td that is the time required for the conversion process of the A/D converter 23 from the time t2 that is the end point of the timing clock CK.

In particular, the calculator 24 performs the acquisition of the digital data D1 using the counters CT1 and CT2 as follows. As shown in FIG. 3, when a time becomes the time t1 that is the start point of the timing clock CK, the counters CT1 and CT2 start a count. When a time becomes the time t2 that is the end point of the timing clock CK, the counter CT1 stops the count, but the counter CT2 continues the count. The calculator 24 stores a count value Cts of the counter CT1 that stops the count at the time t2.

When a count value of the counter CT2 becomes a value equivalent to the group delay Td, the counter CT2 stops the count. Then, the calculator 24 starts the acquisition of the digital data D1 output from the A/D converter 23. Whenever performing the acquisition of the digital data D1, the calculator 24 counts the number of the acquired digital data D1. The calculator 24 finishes the acquisition of the digital data D1 at a time (the time t4) when the count value becomes the count value Cts.

A sampling cycle of the A/D converter 23 is the same as a acquisition cycle of the calculator 24. For this reason, if the calculator 24 acquires the digital data D1, the number of which is equal to the count value Cts from the time t3, it is possible to acquire the digital data D1 (the digital data D1 in section Tb of FIG. 3) sampled in section Ta of FIG. 3 in proper quantities among the digital data D1 continuously output from the A/D converter 23.

Next, an operation of the electromagnetic flowmeter 1 in the above constitution will be simply described. When the operation is initiated, the excitation control signal C1 is output from the calculator 24 to the excitation circuit 21. Then, the excitation signal S1 shown in FIG. 2 is output from the excitation circuit 21 to the detector 10, and thereby the positive excitation and the negative excitation of the exciting coils 11 are alternately performed. When these excitations are performed, a magnetic field based on the positive excitation and a magnetic field based on the negative excitation are alternately applied to the fluid flowing in the measured pipe P. Then, an electromotive force that is proportional to a product of a magnitude (a magnetic flux density) of the magnetic field applied by the exciting coils 11 and the average flow velocity of the fluid is generated in the measured pipe P.

The electromotive force generated in the measured pipe P is detected by each of the two detecting electrodes 12. The flow rate signal S2 shown in FIG. 2 is output from the detecting electrodes 12. This flow rate signal S2 is amplified by the amplifier circuit 22, and is converted to the digital data D1 by the A/D converter 23. The digital data D1 converted by the A/D converter 23 is successively output to the calculator 24, and is acquired by the calculator 24 according to the method described using FIGS. 2 and 3.

When the digital data D1 is acquired, the calculator 24 performs a process of calculating the flow rate of the fluid using the digital data D1. In particular, the calculator 24 performs the process of calculating the average flow velocity of the fluid from the digital data D1 and multiplying the average flow velocity by a cross-sectional area of the measured pipe P to calculate the flow rate of the fluid. Information indicating the flow rate calculated by the calculator 24 is output to the transmitter 30 and transmitted to the outside, and output to and displayed on the display 40.

As described above, in the present embodiment, the calculator 24 starts the acquisition of the digital data D1 output from the A/D converter 23 using the counter CT2 that counts the time required for the conversion process of the A/D converter 23. Furthermore, the calculator 24 finishes the acquisition of the digital data D1 output from the A/D converter 23 using the counter CT1 that counts the time from the start point to the end point of the timing clock CK. For this reason, even if the A/D converter 23 which continuously performs the conversion process is provided, it is possible to accurately and easily acquire only the digital signal D1 converted in synchronization with the timing clock CK.

Figure 4:
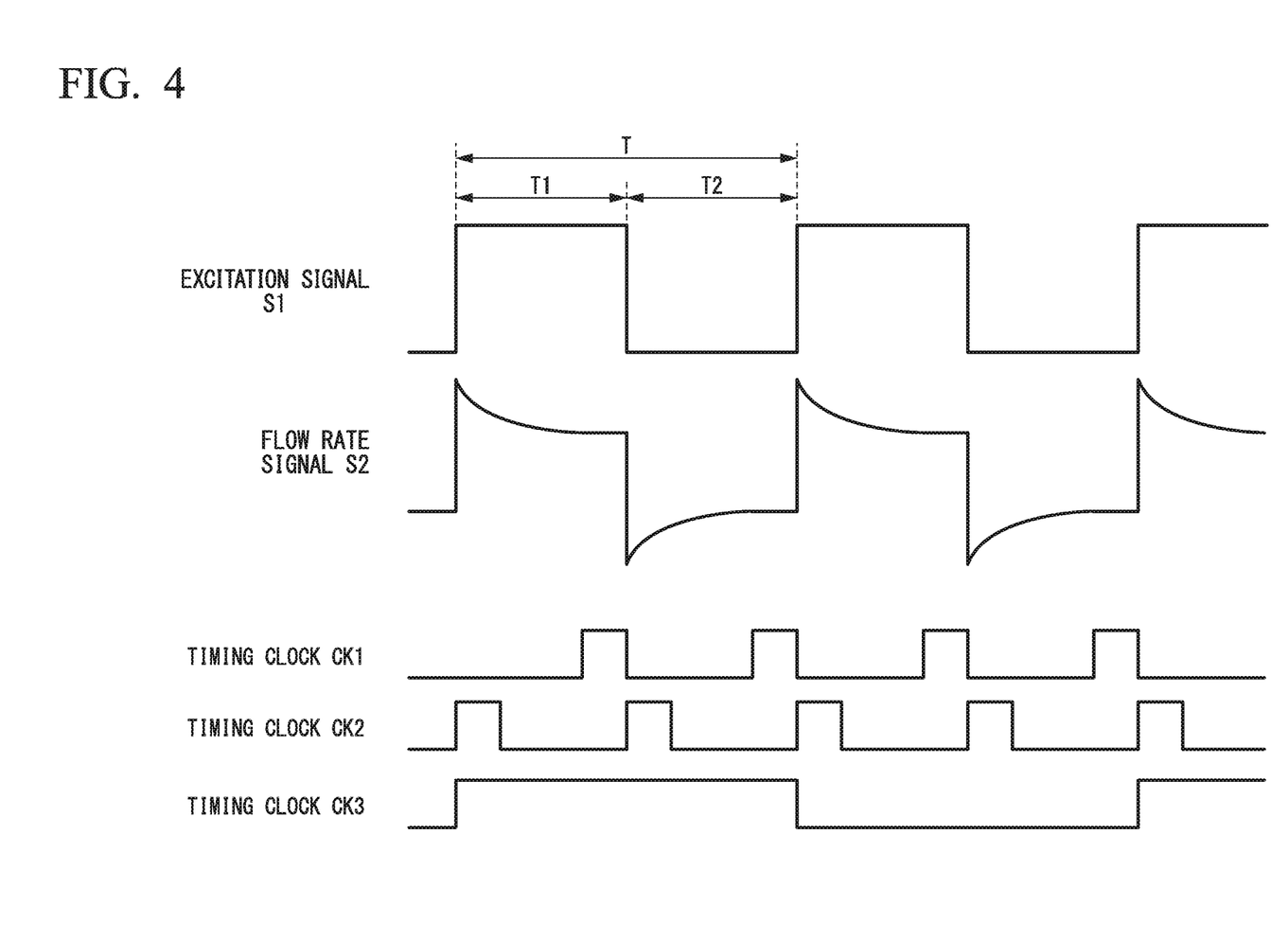
FIG. 4 is a timing chart showing a variation of the acquisition process of the digital data which is performed in the embodiment of the present invention.

In the embodiment described above, the example in which the calculator 24 performs the acquisition of the digital data D1 based on one timing clock CK has been described. However, it is also possible to perform the acquisition of the digital data D1 based on a plurality of timing clocks. However, it is necessary to provide a plurality of counters CT1 and CT2. FIG. 4 is a timing chart showing a variation of the acquisition process of the digital data which is performed in the embodiment of the present invention. In FIG. 4, as in FIG. 2, the excitation signal S1, the flow rate signal S2, and the timing clocks CK are shown.

In the example shown in FIG. 4, three timing clocks CK1 to CK3 are shown. The timing clock CK1 is the same as the timing clock CK shown in FIG. 2, and is used to sample the trailing edge of the section T1 of the positive polarity and the trailing edge of the section T2 of the negative polarity in each cycle of the excitation signal S1. The timing clock CK2 is used to sample a leading edge of the section T1 of the positive polarity and a leading edge of the section T2 of the negative polarity in each cycle of the excitation signal S1. The timing clock CK3 is used to sample the entirety of one cycle of the excitation signal S1 every one cycle of the excitation signal S1.

When the calculator 24 performs the acquisition of the digital data D1 using the timing clock CK1, the calculator 24 acquires the digital data D1 in which the influence of differential noise is small. Also, when the calculator 24 performs the acquisition of the digital data D1 using the timing clock CK2, the calculator 24 acquires the digital data D1 in which the influence of the differential noise is great, and a magnitude of the differential noise can be measured. Thereby, the differential noise having an unusual magnitude can be detected and used for the diagnosis. Also, when the calculator 24 performs the acquisition of the digital data D1 using the timing clock CK3, the digital data D1 for one cycle of the excitation signal S1 is acquired. In this way, with the use of the plurality of timing clocks, it is possible to individually acquire digital data of a plurality of sampling sections.

While the field device according to the embodiment of the present invention has been described, the present invention is not interpreted as being limited to the above embodiment and can be freely modified within the scope of the present invention. For example, in the above embodiment, the electromagnetic flowmeter has been described by way of example. However, the present invention may be applied to another type of flowmeter (e.g., a coriolis-type mass flowmeter) as well as arbitrary field devices (a measure and an operating device).

Also, in the above embodiment, the example in which the clock 25 is provided in the converter 20, and the timing clock CK defining the sampling section is generated by the clock 25 has been described. However, the clock 25 may be omitted, and the timing clock CK may be generated using a timer function (not shown) of the calculator 24.

In addition, in the above embodiment, to facilitate understanding, the group delay of the A/D converter 23 has been described as being constant. However, the group delay of the A/D converter 23 varies according to a type of the A/D converter 23. For this reason, the group delay (the time counted by the counter CT2) of the A/D converter 23 may be set by software or hardware (a switch, etc.). Thereby, it is possible to deal with various types of A/D converters 23.

What is claimed is:

1. A field device, comprising:
   a sensor;
   an analog-digital conversion circuit configured to continuously convert detected signals output from the sensor to digital signals;
   a calculation circuit configured to convert the digital signals to process values by starting acquisition of the digital signals output from the analog-digital conversion circuit at a first point in time that is delayed by a processing time required for the conversion process of the analog-digital conversion circuit from a start point of a timing signal defining a sampling section of the detected signals, and finishing the acquisition of the digital signals output from the analog-digital conversion circuit at a second point in time that is delayed by the processing time from an end point of the timing signal, wherein the calculation circuit comprises:
   a first counter configured to count a time from the start point to the end point of the timing signal; and
   a second counter configured to count the processing time, and a clock configured to output the timing signal, the clock being connected to the calculation circuit.

2. The field device according to claim 1, wherein
   each of the first counter and the second counter is configured to start counting at the start point of the timing signal, and
   the calculation circuit is configured to set a time point when the count of the second counter is finished as the first point and to set a time point when the time counted by the first counter is elapsed from the time point when the count of the second counter is finished as the second point.

3. The field device according to claim 1, wherein
   the timing signal includes a plurality of timing signals, and
   the calculation circuit is configured to individually start and finish the acquisition of the digital signals for each of the plurality of timing signals.

4. The field device according to claim 1, further comprising:
   an output device configured to output the process values converted from the digital signals by the calculation circuit.

5. The field device according to claim 1, wherein
   the field device is an electromagnetic flowmeter configured to detect an electromotive force generated by applying a magnetic field to a fluid to measure a flow rate of the fluid.

6. The field device according to claim 1, further comprising:
   an amplifier circuit configured to amplify the detected signals output from the sensor and to input the amplified detected signals into the analog-digital conversion circuit.

7. The field device according to claim 1, wherein
   the analog-digital conversion circuit is a sigma-delta ($\Delta\Sigma$) type analog-digital conversion circuit.

8. The field device according to claim 4, wherein
   the output device comprises:
   a transmitter configured to convert the process values output from the calculation circuit to transmittable signals and to transmit the transmittable signals to an outside of the field device; and
   a display configured to display the process values output from the calculation circuit.

9. The field device according to claim 5, further comprising:
   an excitation circuit configured to generate an excitation signal to be supplied to the sensor based on an excitation control signal output from the calculation circuit.

10. The field device according to claim 9, wherein
    the excitation circuit is configured to generate the excitation signal, which has a waveform of a rectangular shape, and polarities of which are alternately changed in a predetermined cycle.

11. The field device according to claim 10, wherein
    the sensor is configured to output the detected signals synchronized with the excitation signal.

12. The field device according to claim 10, wherein:
    a frequency of the timing signal output by the clock is set to twice a frequency of the excitation signal.

13. The field device according to claim 2, wherein
    the first counter is configured to stop counting at the end point of the timing signal, and
    the second counter is configured to continue counting at the end point of the timing signal.

14. The field device according to claim 13, wherein
    the calculation circuit is configured to store a value of the first counter at the end point of the timing signal.

15. The field device according to claim 14, wherein
    the calculation circuit is configured to acquire the digital signals, the number of which is equal to the value of the first counter, from the first point.

16. The field device according to claim 9, wherein
    the sensor comprises two exciting coils configured to be excited by the excitation signal and to generate a magnetic field to be applied to the fluid.

17. The field device according to claim 16, wherein
    the exciting coil is configured to alternately apply a first magnetic field based on a positive excitation and a second magnetic field based on a negative excitation to the fluid.

18. The field device according to claim 16, wherein
    the sensor further comprises two detecting electrodes configured to detect the electromotive force.

* * * * *